United States Patent [19]

Trauernicht et al.

[11] Patent Number: 5,650,626

[45] Date of Patent: Jul. 22, 1997

[54] X-RAY IMAGING DETECTOR WITH THICKNESS AND COMPOSITION LIMITED SUBSTRATE

[75] Inventors: David P. Trauernicht, Rochester, N.Y.; John Yorkston, Ann Arbor, Mich.

[73] Assignee: Eastman Kodak Company, Rochester, N.Y.

[21] Appl. No.: 682,910

[22] Filed: Jul. 16, 1996

[51] Int. Cl.$^6$ .................... G01T 1/24; H01L 27/04
[52] U.S. Cl. ...................... 250/370.09; 250/580
[58] Field of Search ............ 250/370.09, 370.12, 250/370.14, 580, 208.1; 378/98.8

[56] References Cited

U.S. PATENT DOCUMENTS

| | | | |
|---|---|---|---|
| Re. 31,847 | 3/1985 | Luckey | 250/327.2 |
| 2,502,529 | 4/1950 | Otis et al. | 95/8 |
| 2,887,379 | 5/1959 | Ralph et al. | 96/82 |
| 3,300,310 | 1/1967 | Kenneth et al. | 96/82 |
| 3,300,311 | 1/1967 | Kenneth et al. | 96/82 |
| 3,552,352 | 1/1971 | Ronald et al. | 118/49.5 |
| 3,617,285 | 11/1971 | William et al. | 96/82 |
| 3,743,833 | 7/1973 | Peter et al. | 250/483 |
| 3,766,383 | 10/1973 | Gerald et al. | 250/51.5 |
| 3,809,903 | 5/1974 | Boong et al. | 250/358 |
| 3,966,852 | 6/1976 | Karl-Heinz et al. | 264/0.5 |
| 4,085,327 | 4/1978 | Robert et al. | 250/370 |
| 4,090,080 | 5/1978 | Christopher | 250/366 |
| 4,180,790 | 12/1979 | Thomas | 367/7 |
| 4,268,750 | 5/1981 | Cowart | 250/315.1 |
| 4,328,418 | 5/1982 | Hugh et al. | 250/213 |
| 4,392,236 | 7/1983 | Donald et al. | 378/45 |
| 4,393,512 | 7/1983 | Wang | 378/156 |
| 4,446,365 | 5/1984 | Peon et al. | 250/213 |
| 4,467,340 | 8/1984 | Jonathn et al. | 357/24 |
| 4,510,573 | 4/1985 | William et al. | 364/498 |
| 4,521,808 | 6/1985 | Poen et al. | 358/111 |
| 4,539,591 | 9/1985 | Alfonso et al. | 358/335 |
| 4,640,291 | 2/1987 | Hoen | 128/660 |
| 4,671,293 | 6/1987 | Shaulov | 128/660 |
| 4,686,694 | 8/1987 | Peter et al. | 378/120 |
| 4,689,487 | 8/1987 | Masayuki et al. | 250/361 |
| 4,763,002 | 8/1988 | Alfonso et al. | 250/370.01 |

(List continued on next page.)

OTHER PUBLICATIONS

"X-Ray Screens", *Research Disclosure*, Feb. 1977, Item 15444. Disclosed by Paul L. Nielsen.

"Polyfluorinated binders for lanthanum oxybromide x-ray screens", *Research Disclosure*, Jun. 1979, Item 18269. Disclosed by Paul L. Nielsen.

(List continued on next page.)

*Primary Examiner*—Michael J. Tokar
*Assistant Examiner*—Virgil O. Tyler
*Attorney, Agent, or Firm*—James D. Leimbach

[57] ABSTRACT

An ionizing radiation imaging detector, for use with a ionizing radiation beam source comprising a pixellated conversion-detection unit, and a substrate supporting the conversion-detection unit. The substrate includes one or more elements having atomic numbers greater than 22, the elements having a total concentration in the substrate of greater than about 1 mole percent relative to the total number of moles of elements having atomic numbers of 22 or less. The substrate has a dimensionless absorption exponent of less than 0.5 for gamma ray emission of $Am^{241}$ at about 60 keV;

where $$AE(Am^{241}\ 60\ keV) = t*(k_1 e_1 + k_2 e_2 + k_3 e_3 + \ldots)$$

and wherein $AE(Am^{241}\ 60\ keV)$ represents the absorption exponent of said substrate relative to the about 60 keV gamma ray emission of $Am^{241}$; t represents said thickness of said substrate in the principle direction of propagation of said x-ray beam; $e_1, e_2, e_3, \ldots$ represent the concentrations of elements in said substrate; and $k_1, k_2, k_3, \ldots$ represent the mass attenuation coefficients of the respective elements.

20 Claims, 2 Drawing Sheets

U.S. PATENT DOCUMENTS

| | | |
|---|---|---|
| 4,778,985 | 10/1988 | Everett et al. .......................... 250/213 |
| 4,793,812 | 12/1988 | Michael et al. ......................... 434/116 |
| 4,803,359 | 2/1989 | Yuichi et al. ......................... 250/327.2 |
| 4,857,723 | 8/1989 | Modisette ............................. 250/213 |
| 4,859,909 | 8/1989 | Rene et al. ......................... 315/111.81 |
| 4,879,469 | 11/1989 | DiBlanca ............................. 250/374 |
| 4,905,265 | 2/1990 | John et al. ............................ 378/99 |
| 4,929,979 | 5/1990 | Tetsuo et al. ............................ 355/38 |
| 4,980,760 | 12/1990 | Seiichiro et al. ....................... 358/80 |
| 5,005,418 | 4/1991 | Anderson ............................. 73/625 |
| 5,017,989 | 5/1991 | Robert et al. .......................... 357/30 |
| 5,043,582 | 8/1991 | John et al. ......................... 250/370.09 |
| 5,051,592 | 9/1991 | Trotel ............................... 250/387 |
| 5,075,555 | 12/1991 | Rolf et al. ......................... 250/370.15 |
| 5,079,426 | 1/1992 | Larry et al. ......................... 250/370.09 |
| 5,090,245 | 2/1992 | Anderson ............................. 73/625 |
| 5,117,114 | 5/1992 | Robert et al. ....................... 250/370.11 |
| 5,134,884 | 8/1992 | Anderson ............................. 73/625 |
| 5,191,439 | 3/1993 | Sumi ................................. 358/447 |
| 5,196,702 | 3/1993 | Kazutaka et al. ..................... 250/327.2 |
| 5,198,673 | 3/1993 | Henri et al. ......................... 250/370.11 |
| 5,227,265 | 7/1993 | Charles et al. ............................ 430/41 |
| 5,254,480 | 10/1993 | Tran .................................... 437/2 |
| 5,262,649 | 11/1993 | Larry et al. ......................... 250/370.09 |
| 5,300,784 | 4/1994 | William et al. ....................... 250/484.2 |
| 5,306,907 | 4/1994 | Sol et al. ............................. 250/214 |
| 5,321,272 | 6/1994 | Pual et al. ......................... 250/515.1 |
| 5,331,179 | 7/1994 | Denny et al. .......................... 250/591 |
| 5,344,731 | 9/1994 | Charles et al. ............................ 430/41 |
| 5,359,207 | 10/1994 | Turner ............................... 257/81 |
| 5,381,014 | 1/1995 | Lothar et al. ....................... 250/370.09 |
| 5,391,879 | 2/1995 | Nang et al. ............................ 250/367 |
| 5,391,881 | 2/1995 | Pierre et al. ....................... 250/370.09 |
| 5,418,377 | 5/1995 | Nang et al. .......................... 250/483.1 |
| 5,420,000 | 5/1995 | Gordhanbhai et al. ................... 430/332 |
| 5,424,544 | 6/1995 | Gail et al. ............................ 250/332 |
| 5,436,458 | 7/1995 | Tran et al. ......................... 250/370.09 |
| 5,440,130 | 8/1995 | John et al. ......................... 250/370.09 |
| 5,442,167 | 8/1995 | Craig et al. ......................... 250/201.2 |
| 5,528,043 | 6/1996 | Spivey et al. ....................... 250/370.09 |
| 5,545,899 | 8/1996 | Tran et al. ......................... 250/370.09 |

OTHER PUBLICATIONS

*Physics of Semiconductor Devices*, 2nd ed., by S.M. Sze, John Wiley & Sons, 1981, pp. 392–393.

"Color Document Imaging with Amorphous Silicon Sensor Arrays", R.A. Street, et al., Materials Research Society Symposium Proc., vol. 336 (1994), pp. 873–878.

"A Simple Method for Determining the Modulation Transfer Function in Digital Radiography", H. Fujita et al., IEEE Trans. Med. Imaging, vol. 11, pp. 34–39 (1992).

"A High Resolution, High Frame Rate, Flat–Panel TFT Array for Digital X–Ray Imaging", L.E. Antonuk et al, S.P.I.E., Physics of Med. Imaging, vol. 2163 (1994), pp. 118–128.

"Modulation Transfer Function of Screen–Film Systems," ICRU Report 41, 15 Aug. 1986.

X-RAY IMAGING DETECTOR WITH THICKNESS AND COMPOSITION LIMITED SUBSTRATE

The U.S. Government has a paid-up license in this invention and the right in limited circumstances to require the patent owner to license others on reasonable terms as provided for by the terms of Grant No. R01-CA56135 awarded by NIH.

FIELD OF THE INVENTION

The invention relates to x-ray imaging and more particularly relates to x-ray imaging detectors and detection systems.

BACKGROUND OF THE INVENTION

Traditional radiography employs a silver halide photosensitive film in combination with an intensifying screen or screens, which are typically composed of a phosphor layer on a support unit, to capture a radiographic image. The resulting black and white image can then be used for medical diagnosis.

Radiographs can also be made using storage phosphor materials in place of prompt emitting intensifying screen phosphors. No film is needed. The storage phosphors store a latent image in the form of trapped charge that is subsequently read out, typically with a scanning laser beam.

Modulated x-radiation can also be imaged using a solid state detector. In these detectors, a converter is coupled with a pixellated array of detection elements. The converter absorbs the x-ray radiation on an image-wise basis and either emits lower energy radiation, such as visible light, or produces electron-hole pairs. The pixellated detection element array receives the emitted radiation or electron-hole pairs and produces a signal modulated in correspondence with the x-ray radiation intensity. A typical detection element array suitable for use with a converter that emits lower energy radiation is an array of photosensitive elements. Examples of these photosensitive elements are photodiodes coupled to individual transistors of a thin-film transistor (TFT) array, or a TFT array itself, or phototransistors. In this type of detection element array, once the lower energy radiation has been converted into electron-hole pairs in the photosensitive elements, the charge is collected and then read out. This can be done in a row-by-row fashion, in a column-by-column fashion using the TFT at each pixel position as a switch or pixel by pixel. A similar TFT array can be utilized with a converter that outputs electron-hole pairs, except that the photosensitive elements are unnecessary. Other types of detection element array can also be used instead of a TFT array, for example, charge coupled devices and charge transport devices.

The detection element array is deposited or otherwise attached to a substrate that provides physical support, for the detection element array and converter. This substrate material is, in many cases, a glass. These substrates currently contain some heavy element addenda to alter the interactions of the substrate with the semiconductor material that is deposited upon it. *Physics of Semiconductor Devices*, S. M. Sze, John Wiley & Sons, 1981, pages 392–393 discusses some of the reasons these addenda are incorporated in the substrate.

One of the key parameters for radiographs is the modulation transfer function (abbreviated herein as "MTF"). This is a measure of the spatial resolution of the particular radiographic system. It is desirable to provide x-ray imaging detectors having the highest MTF achievable.

Known solid state x-ray detectors having a pixellated conversion-detection unit disposed on a support unit. The conversion-detection unit includes a converter or converter layer in combination with a detection array adjoining the converter. In such x-ray detectors, the x-rays from the x-ray beam source (hereafter also referred to the "primary" x-rays or "primary" beam) are not completely absorbed by the converter. Some x-rays are absorbed by the detection array and some pass through the detection array to encounter the support unit. Some atoms, upon absorbing the x-rays emit lower energy "fluorescent" x-rays (hereafter also referred to as "secondary x-rays"). These secondary x-rays are generated by the absorption of x-rays above the K or L absorption edges of the elements. An electron in the K or L shell is ejected by the absorption of the incident x-ray or other high energy particle. When electrons cascade down to fill this vacant lower energy state, secondary x-rays can be produced at energies characteristic for a particular element. Once an incident high energy particle has been absorbed, the efficiency of production and energy of secondary x-rays are dependent upon the atomic number of the element. The secondary x-rays can be emitted in any direction, but those emitted back to the converter can degrade the image to varying degrees depending on the overall design and construction of the detector.

From the foregoing discussion, it should be apparent that there is a need within the art for an x-ray detector that will effectively control the emission of secondary x-rays.

SUMMARY OF THE INVENTION

It has been determined that if the detection array is thin relative to the converter layer (having a thickness in the principle direction of propagation of the primary x-ray beam that is less than $\frac{1}{5}$ of the thickness of the converter in the same direction), then insufficient secondary x-rays are emitted by the conversion-detection array to produce a significant change in the quality of the final image. These dimensions are applicable to known x-ray detectors. It has been determined that, if the support unit is either highly x-ray absorptive or highly x-ray transmissive, then the amount of secondary x-rays emitted to the converter will be insufficient to produce a significant change in the quality of the final image. On the other hand, it has been determined that, if the supporting element is neither highly x-ray absorbing nor highly x-ray transmissive, then the configuration and composition of the support unit or the configuration of both the converter and the support unit are critical to the quality of the final image.

The invention provides for a detector comprising a converter capable of receiving incident x-radiation and transmitting an intermediate signal representative of incident radiation, a pixellated detection unit that is capable of detecting said intermediate signal, said pixellated detection unit being operatively coupled to said converter such that said intermediate signal is provided to pixels within said pixellated detection unit, and a substrate supporting said converter and said detection unit, said substrate having a thickness in the principle direction of propagation of incident x-ray beams insufficient to fully absorb x-ray beams when said substrate is subject to irradiation by x-ray beams penetrating said converter, said substrate including one or more elements having atomic numbers greater than 22, said elements having a total concentration in said substrate of greater than about 1 mole percent relative to the total number of moles of elements having atomic numbers of 22 or less. The substrate has a dimensionless absorption exponent of less than 0.5 for gamma ray emission of $Am^{241}$ at about 60 keV.

wherein $$AE(Am^{241}\ 60\ keV) = t \cdot (k_1 e_1 + k_2 e_2 + k_3 e_3 + \ldots)$$

wherein $AE(Am^{241}\ 60\ keV)$ represents the absorption exponent of the substrate relative to the about 60 keV gamma ray emission of $Am^{241}$; t represents the thickness of the substrate in the principle direction of propagation of the x-ray beam; $e_1, e_2, e_3, \ldots$ represent the concentrations of elements in the substrate; and $k_1, k_2, k_3, \ldots$ represent the mass attenuation coefficients of the respective elements.

It is an advantageous effect of at least some of the embodiments of the invention that x-ray imaging detectors are provided that have an improved MTF.

BRIEF DESCRIPTION OF THE DRAWINGS

The above-mentioned and other features and objects of this invention and the manner of attaining them will become more apparent and the invention itself will be better understood by reference to the following description of an embodiment of the invention taken in conjunction with the accompanying figures wherein.

DETAILED DESCRIPTION OF THE INVENTION

It has been determined that if the detection array is thin relative to the converter layer (having a thickness in the principle direction of propagation of the primary x-ray beam that is less than ⅕ of the thickness of the converter in the same direction), then insufficient secondary x-rays are emitted by the detection array to produce a significant change in the quality of the final image. These dimensions are applicable to known x-ray detectors. It has been determined that, if the support unit is either highly x-ray absorptive or highly x-ray transmissive, then the amount of secondary x-rays emitted to the converter will be insufficient to produce a significant change in the quality of the final image. On the other hand, it has been determined that, if the supporting unit is neither highly x-ray absorbing nor highly x-ray transmissive, then the configuration and composition of the support unit or the configuration of both the converter and the support unit are critical to the quality of the final image.

The effect of the secondary x-rays on the final image is evaluated here in terms of the modulation transfer function (hereafter also referred to as "MTF"). MTF is a measure of image sharpness and the ability to discriminate low contrast detail. (Unless otherwise indicated, MTF values stated herein are at 1 cycle/millimeter.) If a reference image has a particular MTF value at a spatial frequency of 1 cycle/millimeter, then degradation factors (such as degradation due to the secondary x-rays) that result in a final image having an MTF at 1 cycle/mm that is degraded by a factor of 0.02 (2%) or less is considered to have insignificant MTF degradation. This amount of degradation is referred to herein as a degradation factor of 0.98. Comparative changes in MTF are expressed herein in terms of the "degradation factor". The degradation factor expresses the MTF for an improved detector as a percentage (or decimal equivalent) relative to the MTF of the same detector absent substrate or backing (both defined below).

Figure 1:
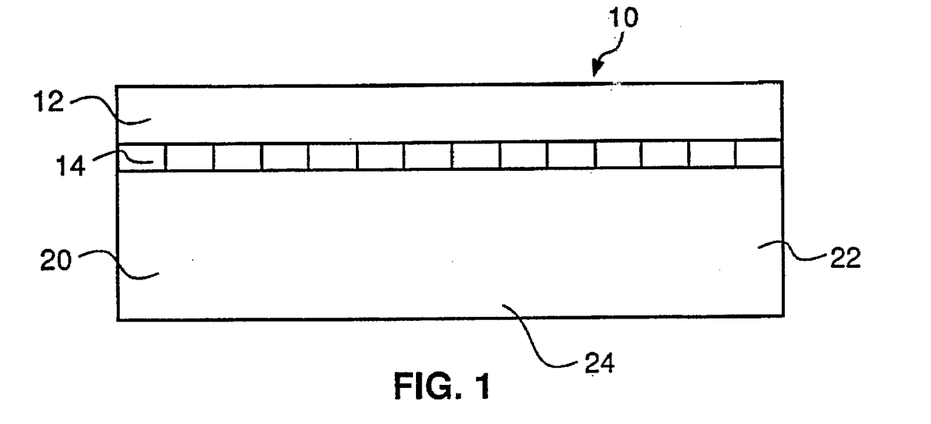
FIG. 1 is a semi-diagrammatical cross-sectional view of an embodiment of the x-ray improved detector.

Referring now to FIG. 1, the improved detector, generally referred to as 10, includes a pixellated conversion-detection unit comprising a converter 12 and a plurality of pixels 15 on detection array 14, and a support unit 16. The detector 10 is a planar structure, typically oriented in a plane perpendicular to the angle of incidence of a primary x-ray beam such that the x-ray beam is directed to first impinge on converter 12. It is also envisioned that the improved detector 10 taught by the present invention have other shapes, or that the x-ray beam impinge upon the detector 10 from a different direction. For example, the detector can have a simple curved or complex three dimensional shape. Also, the x-ray beam could propagate from a direction such that it will first be incident on the support unit 16 rather than the converter unit 12. Furthermore, the x-ray beam can be inclined relative to the detector. As a matter of convenience, the detector will be generally described herein in terms of the planar example shown in FIG. 1 with the x-ray beam first incident upon the converter 12.

The converter 12 and detection array 14 function as a unit within improved detector 10. The converter 12 can typically be a phosphor that emits photons in reaction to incident x-rays. These photons then impinge upon detection array 14 having pixels 15 constructed from either a photodiode or phototransistor technology. Another configuration for the unit of converter 12 and detection array 14 would have the converter 12 constructed from a photocoupler that reacts to incident x-rays by emitting electrons to detection array 14. Here detection array 14 would be more of an electrode type technology. In either case the detection array 14 comprises a pixellated detection array that receives a converted representation of the incident x-rays. The converter 12 receives a beam of x-rays and produces an intermediate signal in response to the x-rays. The detection array 14 collects the intermediate signal from the converter 12 and produces a detector signal responsive to the intermediate signal received at the pixels 15 of detection array 14. The detector signal can be used to produce a perceptible representation of the imaging information (hereinafter also referred to as the "final image"). Modulation of the collector signal corresponds to image-wise modulation of the x-ray beam. The conversion-detection unit can include one or more other layers to provide some physical support for the converter, protect the unit from abrasion and the like.

The support unit 20 lies beneath detection array 14 and includes a substrate 22 that has certain, specific properties. The substrate 22 is at a surface of the support unit 20 that it is essentially adjacent and adjoining the interface between the support unit 20 and the detection array 14. The substrate 22 is irradiated by x-rays that have passed through the converter layer 12. These x-rays are partially absorbed by the substrate 22 and can be partially remitted or transmitted as a significant quantity of secondary x-rays to back to the converter 12. Here, a significant quantity of secondary x-rays is defined herein as an emission of secondary x-rays at an intensity that is more than 3% of the intensity of the primary x-ray beam impinging on the support unit.

A backing 24 is envisioned as being disposed on a surface of the support unit 20 opposite the surface containing the interface between the substrate 22, and detection array. The backing provides physical support for converter 12 and detection array 14. Additionally, the backing 24 can provide a function blocking further propagation of the x-ray beam or providing a coupling to an examination table or other component. The backing 24 is subject to irradiation by the primary x-ray beam, after passage through intervening components. In currently preferred embodiments of the invention, the backing 24 is disposed to receive the primary x-ray beam after the beam has propagated through the substrate 22. The backing 24 emits an insignificant quantity of secondary x-rays to the converter, that is, the backing 24 emits secondary x-rays to the converter 12 at an intensity that is of no more than 3% of the intensity of the primary x-ray beam impinging on the support unit 20.

The substrate 22 can be a unitary structure having a substantially uniform composition, or can vary in composition or structure or both. The backing 24 can be a formed on a support unit 20 comprising a unitary base that also includes the substrate 22. In an alternative embodiment, the backing 24 may be a secondary structure discrete from the substrate. It is envisioned that this secondary structure could conceivably be part of a larger article such as an examination table or radiation shielding. The backing 24 could also be a combination of both a sublayer and a secondary structure. Another embodiment could have one or more parts of the backing 24 spaced apart from the substrate 22 by one or more air gaps.

For example, the support unit 20 could have alternating layers such that a moderately x-ray absorbing layer is adjacent to a less x-ray absorbing layer. Also, a series of moderately x-ray absorbing layers could be separated by air gaps. The substrate 22 also includes all parts of the support unit 20 through which the secondary x-rays are transmitted to the converter 12, even if those intervening parts do not themselves emit secondary x-rays to the converter 12.

In another example, the unit comprising the converter 12 and detector 14 is supported by a relatively thin plate backed up by metal radiation shielding or an air gap followed by radiation shielding. In this case, the plate is the substrate. The radiation shielding is the backing and emits secondary x-rays to the converter at an intensity that is of no more than 3% of the intensity of the primary x-ray beam impinging on the support unit 20.

In the improved detector 10, the substrate 22 can be composed of a variety of materials, such as inorganic or organic polymer, metal, and glass and can be a composite of two or more materials as long as the substrate meets the following criteria. The substrate 22 comprises predominantly of one or more elements having atomic numbers of 22 or less (also referred to herein as "lighter elements"), and includes one or more elements having atomic numbers greater than 22 (also referred to herein as "heavier elements"). The heavier elements can be present as contaminants, but in preferred embodiments of the invention are present to provide a beneficial effect. The concentration of heavier elements in the substrate 22 is moderate, that is, greater than about 1 mole percent and less than about 25 mole percent relative to the total number of moles of elements.

The heavier elements in the substrate 22 effect the absorption of primary x-rays and both the emission and reabsorption of secondary x-rays. The greater the percentage of the primary x-radiation that is above the K or L absorption edge absorbed by the heavier elements, the larger the potential signal due to emitted K or L secondary x-rays. In use, the amount of secondary x-rays depends upon the x-ray spectrum used for the imaging task desired and the absorption of the converter material placed on top of the detector. The improved detector 10 disclosed herein solves the problem of final image MTF degradation for x-ray spectra produced by x-ray tubes operated in the range of 20 to 150 kVp, or other ionizing radiation.

A solution is to limit the thickness of the substrate 22 and concentration of heavier elements in the substrate 22 to yield an improved detector, also referred to herein as a "substrate-thickness-and-composition-limited detector". In this improved detector, the concentration of heavier elements in the substrate 22 is less than a maximum that is a function of the identities of the heavier elements present in the substrate, their x-ray absorption and re-emission characteristics, their concentrations, and the positions of the atoms of heavier elements within the substrate relative to the converter layer and to each other. The effect of the heavier elements on secondary x-ray emission can be quantified, by a parameter referred to herein as the "absorption exponent". The absorption exponent is a physical parameter that is equal to the negative of the natural logarithm of the x-ray transmittance. Since transmittance varies with x-ray energy, the absorption exponent is more conveniently expressed relative to x-rays emitted by a standard radiation source. A convenient standard is the 59.57 keV (hereafter 60 keV) gamma ray emission of $Am^{241}$. This source is in the middle range of x-ray energies typically used in medical imaging, 20 to 150 keV, and is commonly used as a source of monoenergetic x-rays for experiments.

The absorption exponent can be measured directly or can be calculated using the following formula (expressed here for a 60 keV gamma ray emission $Am^{241}$ source):

$$AE(Am^{241}\ 60\ keV)=t\cdot(k_1 e_1+k_2 e_2+k_3 e_3+\ldots)$$

where $AE(Am^{241}\ 60\ keV)$ represents the absorption exponent of the substrate relative to the about 60 keV gamma ray emission of $Am^{241}$; t represents the thickness of the substrate in the principle direction of propagation of the primary x-ray beam; $e_1, e_2, e_3, \ldots$ represent the concentrations of elements in the substrate; and $k_1, k_2, k_3, \ldots$ represent the mass attenuation coefficients of the respective elements. As the formula indicates, the absorption exponent is equal to a thickness dimension multiplied by the sum of the products of the mass attenuation coefficient for each element in the substrate 22 at the about 60 keV gamma ray emission of $Am^{241}$ and the respective concentration of each element in the substrate 22. The absorption exponent is dimensionless. (The selection of appropriate units for calculating AE is trivial. For example, if the mass attenuation coefficients are expressed in $cm^2/mole$, the concentrations should be expressed in $moles/cm^3$, and the thickness in centimeters.) Table A is a table of mass attenuation coefficients from information in *Nuclear Data Tables*, Vol. A7, Storm et al., (1970) p. 565–681. The units of the coefficients in Table A are $cm^2/mole$.

The absorption exponent is independent of the distribution of each element in the substrate 22 in the depth direction, i.e., the direction of propagation of the primary x-ray beam. Distribution of each element in the other two directions, i.e. perpendicular to the incident primary x-ray beam, is preferably substantially uniform, at least over areas of a few pixels, or more preferably from pixel to pixel. For example, heavier elements can be limited to a thin layer, with the rest of the substrate being composed of lighter elements. Substantial non-uniformities of the elemental composition and other features of the detector could be accommodated by appropriate processing of the detector signal; however, this adds complexity and is not preferred.

The $AE(Am^{241}\ 60\ keV)$ for the improved detector is equal to or less than 0.5. This provides for a degradation factor of about 0.9 or higher, irrespective of the thicknesses of converter and substrate. The $\Delta E(Am^{241}$ 60 keV) for the improved detector is preferably less than 0.3, which provides for a detection factor of about 0.94 or higher.

Referring hereafter to the improved detector, if the absorption of the primary x-ray beam by the converter 12 can be maintained and all other considerations being equal, a relatively thinner converter 12 is preferred over a relatively thicker converter 12. The converter 12 thickness, in any case is preferably no more than about 1.0 mm and, for practical reasons, no less than about 0.05 mm. The thickness of the converter 12 does not include supportive films or the like, but rather is limited to the converter 12 itself.

The spacing between the substrate 22 and the converter 12 is preferably negligible in comparison to the thickness of the converter 12 or the substrate 22. The invention is, however, inclusive of detectors having a spacing between the converter 12 and the substrate 22 that is about the thickness of the converter, or the substrate, or a large fraction of that thickness. Such a spacing is not considered to be part of the converter 12 or substrate 22 for the purposes of calculating the absorption exponent. Even if the spacing is predominantly occupied by a low x-ray absorptivity material, the negative effects of the spacing on overall MTF is very great due to the greater spread of secondary x-rays emitted by the substrate 22.

The converter 12 includes a material that, in response to x-radiation, produces the intermediate signal in the form of either radiation in the range of 250–1000 nm or a charge separation (hereafter also referred to as "x-ray-to-light converters" and "x-ray-to-charge converters" respectively). A wide variety of x-ray-to-light converters and x-ray-to-charge converters are well known to those of skill in the art.

The x-ray-to-light converter 12 can be a conventional radiographic intensifying screen or the equivalent of a luminescent layer of such a screen. Intensifying screens have a luminescent layer in which prompt emitting phosphor is dispersed as a particulate in a polymeric matrix and have additional layers such as support layers, protective overcoats, and retainers. Suitable prompt emitting phosphors are well known, for example, rare-earth oxysulfides doped with a rare-earth activator, e.g., $Gd_2O_2S$:Tb, calcium tungstate, yttrium oxide, barium fluorohalide, $HfO_2$:Ti, $HfGeO_4$:Ti, $LuTaO_4$, $Gd_2O_3$:Eu, $La_2O_2S$, LaOBr, CsI, $YTaO_4$. Blends of different phosphors can also be used. The median particle size utilized is generally between about 0.5 and about 40 micrometers. A median particle size of between 1 and about 20 micrometers is preferred for ease of formulation, as well as optimizing properties, such as speed, sharpness and noise.

A x-ray-to-light converter 12 can be prepared using conventional coating techniques where the phosphor powder is mixed with a solution of a resin binder material and coated by means such as blade coating onto a substrate. While it is in theory possible to prepare a luminescent layer that does not contain any ingredient other than the phosphor itself, generally the luminescent layer contains in addition to phosphor particles a polymeric binder to give structural coherence to the luminescent layer. Useful binders are those conventionally employed in the art. The binders can be chosen from a wide variety of known organic polymers which are transparent to x-rays, stimulating, and emitted light. Binders commonly employed in the art include sodium o-sulfobenzaldehyde acetal of poly(vinyl alcohol); chlorosulfonated poly(ethylene); a mixture of macromolecular bisphenol poly(carbonates) and copolymers comprising bisphenol carbonates and poly(alkylene oxides); aqueous ethanol soluble nylons; poly(alkyl acrylates and methacrylates) and copolymers of poly(alkyl acrylates and methacrylates with acrylic and methacrylic acid); poly(vinyl butyral); and poly(urethane) elastomers. These and other useful binders are disclosed in U.S. Pat. Nos. 2,502,529; 2,887,379; 3,617,285; 3,300,310; 3,300,311; and 3,743,833; and in *Research Disclosure*, Vol. 154, February 1977, Item 15444, and Vol. 182, June 1979. *Research Disclosure* is published by Kenneth Mason Publications, Ltd., Emsworth, Hampshire P010 7DD, England. Any conventional ratio of phosphor to binder can be employed. Generally thinner phosphor layers and sharper images are realized when a high weight ratio of phosphor to binder is employed. Phosphor to binder ratios are in the range of from about 7:1 to 25:1 are convenient. The x-ray-to-light converter is not limited to the use of crystalline phosphors for x-ray conversion. For example, the x-ray-to-light converter can use a scintillating glass or an organic scintillator.

The x-ray-to-charge converters utilize a photoconductive material to produce a charge separation in response to x-radiation. The charge is collected on a pixel-by-pixel basis by the detection array. Suitable photoconductive materials and element preparation methods are well known to those of skill in the art. For example, the photoconductive material can be selected from such materials as selenium, PbO, TlBr, Se, $HgI_2$, $CdWO_4$, CdTe, CdS, $PbI_2$, CdSe, CdTeSe, C(diamond), GaAs, Ge, Si, $Hg_{(1-x)}Cd_xTe$, ZnTe, $Cd_{(1-x)}ZnxTe$. Useful photoconductive materials are disclosed in "Semiconductors for Room-Temperature Radiation Detector Applications", *Materials Research Society Symposium Proceedings*, Volume 302, R. B. James et al., editors, Materials Research Society, 1993.

The unit comprising the converter 12 and detection array 14 also includes array of pixels 15. The converter 12 may or may not be pixellated. An example of a converter 12 that is pixellated could have pixel units within converter 12 that are associated with photodiodes. Alternatively, a continuous layer of converter material can overlie the detection array 14. The detection array 14 is generally described herein as an electronic structure; however, the detection array 14 is also inclusive of comparable opto-electronic and optical structures.

The unit comprising the converter 12 and detection array 14 has multiple layers. Each of these layers can have multiple sublayers. Individual layers or sublayers can be repeated. For example, the converter 12 and detection array 14 can be formed in a modular fashion such that, in effect, one or more conversion-detection assemblies overlie another conversion-detection unit. Differing converters and/ or detection arrays can be interspersed together, for example, in alternating pixels or in different areas.

Figure 2:
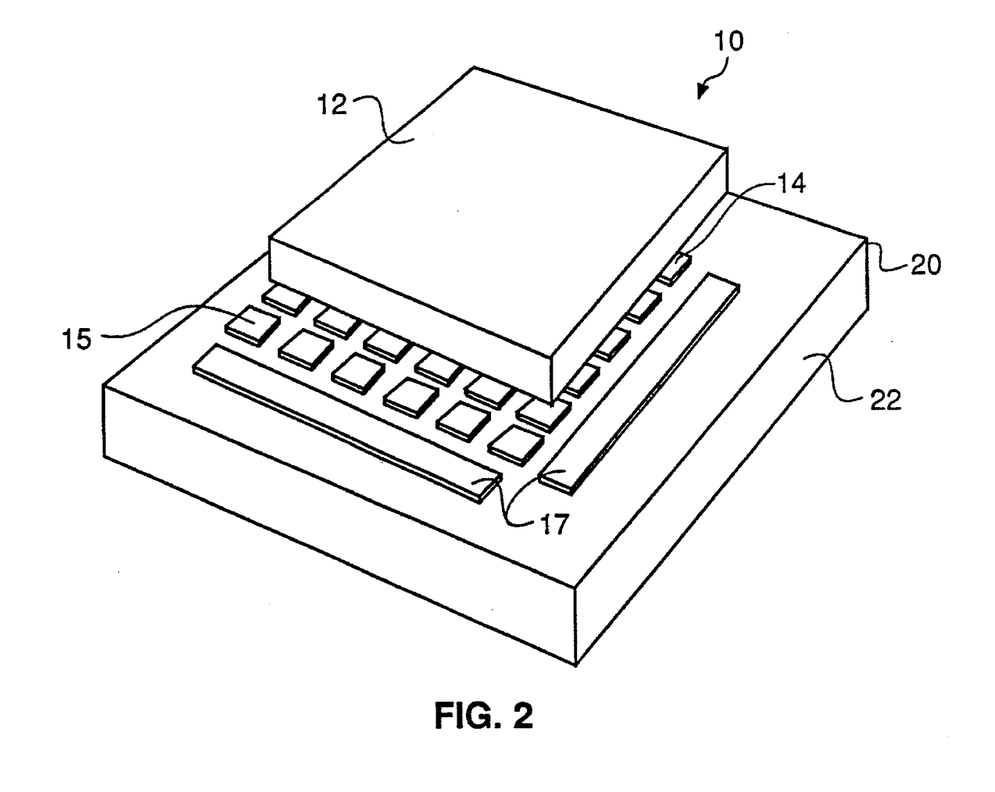
FIG. 2 is a semi-diagrammatical perspective view of the improved x-ray detector of FIG. 1.

Referring now to the electronic detection array illustrated in FIG. 2, the detection array 14 includes a plurality of the pixels 15 and a primary addressing structure 17. Each of the pixels 15 includes a receptor (not shown) that is responsive to the localized intermediate signal and a pixellated secondary addressing structure (not shown) that interacts with the primary addressing structure 17 to provide the modulated signal. The receptor generates an electrical impulse in response to absorbed radiation or collects charge from the photoconductor. The secondary addressing structure provides for addressing and signal extraction. The secondary addressing structure can take a variety of forms, for example, a thin-film transistor or back-to-back diodes, which are coupled to either a photosensitive area or a collection electrode. An example of a suitable thin film transistor-photodiode detection array is disclosed in U.S.

Pat. No. 5,262,649. Examples of a suitable thin film transistor-collection electrode detection array and a suitable back-to-back diode-collection electrode detection array are disclosed in U.S. Pat. No. 5,319,206. This second layer can have multiple sublayers as described in the above referenced patents.

Additional support layers or protective coatings can be provided. Although it is envisioned that the detector 10 of the patent will be most useful as such a 3 layer unit, additional 3 layer units could be superimposed upon each other for particular applications to produce a multi-structured detector.

Figure 3:
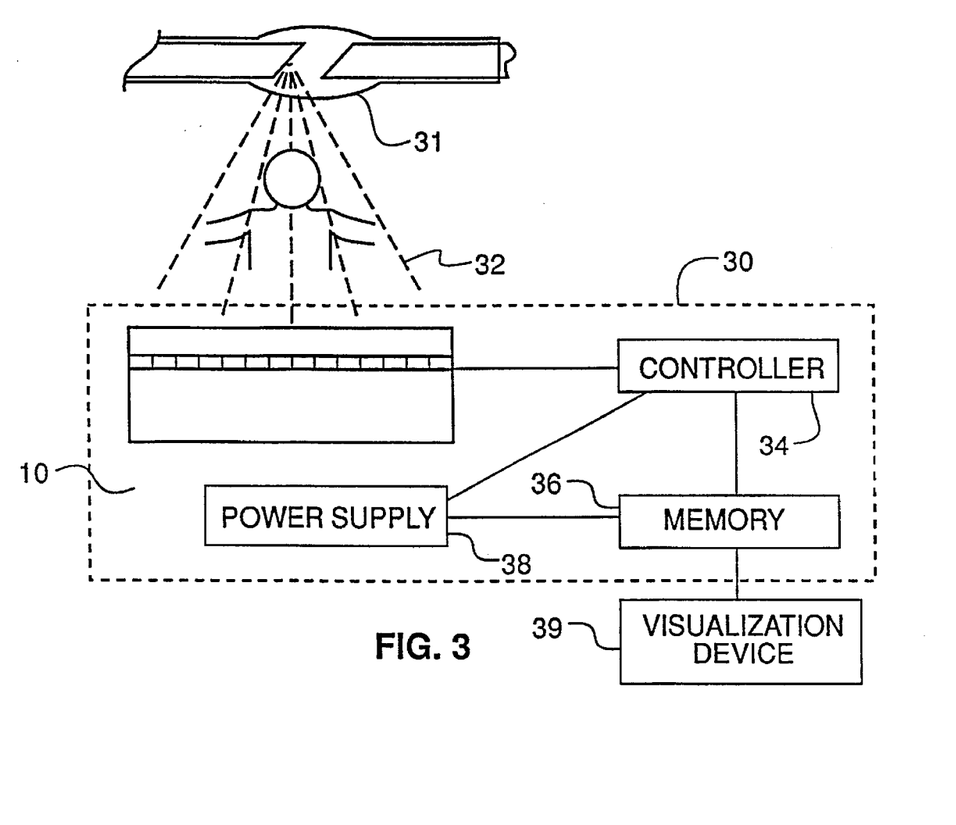
FIG. 3 is a schematic diagram of an x-ray detection system of the invention which incorporates the x-ray detector of FIG. 1.

Referring now to FIG. 3, the improved x-ray detection system of the invention includes the improved x-ray detector 10. The detection system has a high energy radiation source 31, symbolized as an x-ray tube. The high energy radiation is generally referred to herein as "x-rays" or "x-radiation" and similar terms are used in relation to the invention: "x-ray detector", x-ray detection system", and the like. The detectors and detection systems disclosed herein are not limited to x-radiation, but rather are also useful in the detection of other high energy radiation capable of inducing secondary x-ray emission from a detector substrate; for example, gamma radiation.

The emission of the high energy radiation source is modulated by a patient or other object of interest and then received by the detection unit of the invention, indicated by dashed lines 32 in FIG. 3. The detection unit includes a control subsystem and the improved detector. The improved detector provides a signal responsive to the modulated high energy radiation. The control subsystem receives the signal and provides for transmission of the signal to a visualization device, which generates a perceptible image corresponding to the image information in the signal for immediate or delayed use by the practitioner or other user (hereafter "practitioner").

The Components of the x-ray detection system 30 shown in FIG. 3, other than detector 10, are well known to those skilled in the art and can be varied to meet the requirements of particular uses. For example, in the x-ray detection system shown in FIG. 3, the visualization device is separate from the detection unit 10 and acts on a signal transmitted from detection system 30. The detection system 30 typically requires a controller 34, memory 36, and a power supply 38 for detector 10 to be operative. A wide variety of other configurations can be used. For example, the visualization device 39 can be integrated into the control unit, the memory can be deleted in favor of a direct path from the controller to the visualization device, and the path between the detector unit and visualization device can be replaced by manual transfer of a memory store, such as a writable compact disc or the like. Similarly, the detection unit itself can be portable or fixed in place. If portable, the detection unit can include an internal power supply or can access power at appropriately configured stations for receiving and transmitting the image information. The controller used in the detection unit can be a microprocessor which controls addressing and signal extraction, and digitization. Furthermore, control circuitry can be incorporated into the detector array 10. The memory can be local or remote from the controller and can store the digital information in any of a wide variety of digital formats well known to those skilled in the art. A variety of other configurations will be apparent to those of skill in the art.

The following Examples and Comparative Examples are presented to further illustrate and elucidate some preferred modes of practice of the invention. Unless otherwise indicated, all starting materials were commercially obtained.

COMPARATIVE EXAMPLES 1–3

Intensifying Screen+TFT Detection Array+"Heavy" Substrate

The image sharpness was measured of a pixellated radiographic imaging detector in which the unit comprising the converter 12 and detector array 14 was composed of a radiographic intensifying screen juxtaposed against a detection array having a thin film transistor (also referred to herein as a "TFT") and photodiode at each pixel. The detection array 14 had been deposited on a uniform composition glass substrate, 1.1 millimeters thick, marketed by Corning Glass Works of Corning, N.Y. as glass #7059. (As a matter of convenience, a substrate 22 including this glass is sometimes referred to hereafter as "heavy".)

The heavy substrate had the following composition: 0.0225 moles/cc $SiO_2$, 0.00271 moles/cc $Al_2O_3$, 0.00595 moles/cc $B_2O_3$, 0.0045 moles/cc BaO. (The substrate also included approximately 1 weight percent $As_2O_3$, however, this concentration is too low relative to the other heavier elements to warrant consideration). The substrate 22 has a density of 2.76 grams/cc. The mass attenuation coefficients for each element at 59.57 keV are given in Table A. Computing the sum of the products of the total moles/cc times the mass attenuation coefficient gives 5.851 $cm^{-1}$. The substrate 22 is 1.1 mm thick, so the AE($Am^{241}$ 60 keV) equals 0.644. The AE($Am^{241}$ 60 keV) was also measured directly at 59.57 keV using an $Am^{241}$ source and a NaI(Tl) scintillating detector with a pulse height analyzer. Two ⅛ inch lead apertures were used to collimate the beam (one half-way between the $Am^{241}$ source and the NaI(Tl) detector, and the other in front of the NaI(Tl) detector). A long acquisition time was used to minimize the uncertainty in the measurement. The measured transmittance of the substrate was 0.525. To get the measured AE as defined above, the negative of the natural logarithm of the transmittance is calculated. This yielded 0.644, the same as the calculated value.

The detection array 14 and substrate 22 were prepared in a manner equivalent to the arrays and substrates described in the following references: "Color Document Imaging with Amorphous Silicon Sensor Arrays", R. A. Street, et al., *Materials Research Society Symposium Proc.*, Vol. 336 (1994) pp. 873–878; and "A High Resolution, High Frame Rate, Flat-Panel, TFT Array for Digital X-ray Imaging", L. E. Antonuk, et al., *S.P.I.E., Phys. of Med. Imaging*, Vol. 2163 (1994) pp. 118–128. The detection array 14 had a spacing between pixels 15 of 127 microns and the photodiode active area was 35% of the total area of the device.

The screens used were $Gd_2O_2S$:Tb at a coating weight of phosphor of approximately 31.5 $g/ft^2$, 45 $g/ft^2$, and 65 $g/ft^2$. The luminescent layers had approximate thicknesses of 80 micrometers, 130 micrometers, and 180 micrometer, respectively and were each coated on a sheet of 7 mil polyethylene terephthalate. The sheets had a total concentration of heavier atoms of less than 1 weight percent relative to the total weight of the sheet and a calculated AE($Am^{241}$ 60 keV) of less than 0.2.

The image sharpness was determined by measuring the Modulation Transfer Function (MTF) using the angled-slit technique disclosed in "A Simple Method for Determining the Modulation Transfer Function in Digital Radiography", H. Fujita et al., *IEEE Trans. Med. Imaging*, vol. 11, pp. 34–39 (1992). In this technique, primary x-rays are incident through a slit in a tungsten carbide element. The slit was very narrow (approximately 13 microns wide) and very long (approximately 10 cm). The x-rays initially impinged on the backside of the intensifying screen, with the screen facing the detection array. The x-ray beam quality used was 90 kVp, 3 mm Al, and a tungsten target tube. The x-ray slit was placed at a small angle with respect to one of the imaging array matrix directions. When the image of the slit was obtained, the presampled MTF was determined on the basis that through the use of the angled slit, the spacing between the middle one of the pixels 15 and the middle of the slit changes in very small steps (much smaller than the pixel dimension) as neighboring lines that are nearly perpendicular to the slit are examined. The sampling provided by these neighboring lines was combined together to yield the slit image profile as a very fine sampling (much finer than the physical spacing of the pixels in the TFT array. The Fourier transform of this finely sample slit profile was calculated to obtain the presampled MTF. The MTF at 1 cycle/mm of this imaging detector with the three different screens is shown in Table 1.

TABLE 1

Intensifying screen + TFT detection array + "heavy" substrate

| Comparative Example | Screen Coverage | 1 cycle/mm MTF |
|---|---|---|
| Comparative Example 1 | 31.5 g/ft$^2$ | 0.632 |
| Comparative Example 2 | 45 g/ft$^2$ | 0.514 |
| Comparative Example 3 | 65 g/ft$^2$ | 0.481 |

COMPARATIVE EXAMPLES 4–6

Intensifying Screen+Film (no substrate)

A standardized detection array deposited on a variety of different substrates was determined to be unavailable, therefore in these and some other comparative examples herein a sheet of photographic film was used in place of the detection array 14. All components were evaluated in a vacuum cassette, which assured excellent contact between layers. Resulting MTF measurements on various substrates, using the intensifying screens indicated, were determined to provide results that, after the below described mathematical adjustment, can be directly compared to results using a detection array.

Sheets of MinR-M film marketed by Eastman Kodak Company, Rochester, N.Y., were juxtaposed against the screens used in Comparative Examples 1–3. The support sheet for the film had a thickness of 7 mil. The sheet had a total concentration of heavier atoms of less than 1 weight percent relative to the total weight of the film and a calculated AE(Am$^{241}$ 60 keV) of less than 0.2. The screen-film pairs were then placed in a blackened aluminum-backed vacuum cassette with a black plastic front. The loaded cassette was then exposed to x-rays, with the x-rays propagating in the direction of the plastic front of the cassette, then the intensifying screen, then the aluminum back of the cassette, then a radiation shield. The back and front of the cassette had a total concentration of heavier atoms insufficient to affect the MTF measurement. The radiation shield was metallic lead having a thickness of greater than 1 mm.

X-rays were provided through a very narrow slit in a platinum plate. The slit was approximately 10 microns wide and approximately 10 mm high in accordance with the procedure disclosed in "Modulation Transfer Function of Screen-Film Systems", *ICRU Report* 41, (1986), p.14. The x-rays impinged on the support side of the screen with the screen facing the film. The x-ray beam quality used was 90 kVp, 3 mm Al, tungsten target tube. Since the film has a non-linear response, multiple exposures of the slit image were made at different x-ray exposures. The profile of the density of each slit image was measured with a scanning densitometer.

The density profiles were mapped to exposure profiles using the measured density vs. log(exposure) response of the film. Given the non-linear nature of film, the profile does not go to zero, so the remaining profile was extrapolated to zero value with a fitted exponential function. The Fourier transform of this profile was calculated to provide the screen+film MTF. These film-substrate MTF data were then adjusted for the MTF degradation due to the well-known effect of the finite size of the pixels in the TFT array (sinc function). In view of the absorption exponents discussed above, the MTF values reported in Table 2 are substantially equal to the values for the three conversion-detection units in the absence of a substrate other than the film support and cassette. (For convenience, this is indicated in Table 2 as "no substrate".

TABLE 2

Intensifying screen + film (no substrate)

| Comparative Example | Screen Coverage | MTF at 1 cycle/mm |
|---|---|---|
| Comparative Example 4 | 31.5 g/ft$^2$ | 0.750 |
| Comparative Example 5 | 45 g/ft$^2$ | 0.603 |
| Comparative Example 6 | 65 g/ft$^2$ | 0.546 |

COMPARATIVE EXAMPLES 7–9

Screen-film pairs were prepared as in Comparative Examples 4–6, respectively, except in each of Comparative Examples 7–9, a piece of 1.1 mm thick Corning glass #7059, marketed by Corning Incorporated of Corning, N.Y., was juxtaposed against the film sheet opposite the intensifying screen. The x-rays passed through the screen, then the film, then the substrate material. The data were adjusted for a finite pixel size in the same manner as in Comparative Examples 4–6. MTF results at 1 cycle/mm a presented in Table 3 along with a degradation factor equal to the MTF values for Comparative Examples 7–9 divided by the MTF values for Comparative Examples 4–6, respectively. No degradation would yield a degradation factor of one.

TABLE 3

Intensifying screen + film + heavy substrate

| Comparative Example | Screen Coverage | MTF at 1 cycle/mm | Degradation factor |
|---|---|---|---|
| Comparative Example 7 | 31.5 g/ft$^2$ | 0.706 | 0.940 |
| Comparative Example 8 | 45 g/ft$^2$ | 0.556 | 0.922 |
| Comparative Example 9 | 65 g/ft$^2$ | 0.493 | 0.903 |

COMPARATIVE EXAMPLES 10–12

Intensifying Screen+Film+Light Substrate

Screen-film pairs were prepared and evaluated as in Comparative Examples 7–9, respectively, except that the substrate used in each of Comparative Examples 10–12, was a piece of 1.1 thick glass, provided by Corning Incorporated of Corning, N.Y. as glass #1737. (This glass is disclosed in "Properties of Glass Substrates for Poly-Si AMLCD Technology," D. M. Moffatt, *Materials Research Society Symposium Proceedings*, Vol. 377 (1995) pp. 871–876.) The glass included about half the mole percentage of BaO that is present in the #7059 glass used in Comparative Examples 7–9. The substrate had an estimated AE(Am$^{241}$ 60 keV) of 0.3. (As a matter of convenience, a substrate including this glass is sometimes referred to hereafter as "light substrate".) Degradation factors were calculated in the same manner as in Comparative Examples 7–9. Results are presented in Table 4.

TABLE 4

Intensifying screen + film + light substrate

| Comparative Example | Screen Coverage | MTF at 1 cycle/mm | Degradation factor |
|---|---|---|---|
| Comparative Example 10 | 31.5 g/ft$^2$ | 0.737 | 0.983 |
| Comparative Example 11 | 45 g/ft$^2$ | 0.579 | 0.960 |
| Comparative Example 12 | 65 g/ft$^2$ | 0.515 | 0.943 |

HYPOTHETICAL COMPARATIVE EXAMPLES 13–18 AND HYPOTHETICAL EXAMPLES 19–21

The photographic film used in Comparative Examples 4–12 could be replaced by a detection array, such as the one used in Comparative Examples 1–3. Results would show MTF values and degradation factors very similar to those presented in Tables 2–4.

SIMULATION COMPARATIVE EXAMPLES 22–24

Comparative Examples 1–3 were repeated by computer simulation. Monte Carlo techniques were used to simulate secondary x-rays (K or L depending on the element of interest and the x-ray energy of interest) traveling in any random direction within the substrate.

For the incident primary x-ray spectrum, tables of published spectra were used from "Catalogue of Spectral Data for Diagnostic X-rays," Birch et al., The Hospital Physicists' Assoc. (1979) and the primary x-rays were then mathematically passed through the layers of the imaging detector. The same lateral position was used for all secondary x-ray generation events (a point source), but the number of x-rays generated varied with depth into the substrate as an exponential function with a characteristic absorption length, $L_{gen}$. The reabsorption of the generated x-ray within the substrate also followed an exponential function with a characteristic absorption length, $L_{sub}$. Secondary x-rays that escape the substrate and propagate to the converter are absorbed in the converter following an exponential function with a characteristic absorption length, $L_{conv}$. Appropriate values for the $L_{gen}$, $L_{sub}$, and $L_{conv}$, were determined from tables of mass attenuation coefficients Storm and Israel, *Nuclear Data Tables*, vol. A7, p.565–681 (1970) given the composition and density of each component of the system. The incident x-ray spectrum was mathematically passed through the converter layer and then the substrate. Based on the fractional transmittance of the substrate, a value for $L_{gen}$ was determined. Using an average energy of 32 keV for the barium K x-rays, a value for $L_{sub}$ and $L_{conv}$ were determined by using the mass attenuation coefficients. The substrate had a thickness of $t_{sub}$ and the converter had a thickness of $t_{conv}$. Values used for $t_{sub}$ and $t_{conv}$ were actual thicknesses of the converter and substrate of Comparative Examples 1–3. The thickness of the detection array was assumed to be small relative to the substrate and the converter.

The lateral distance projected along one axis of any reabsorption event of an x-ray in the converter layer was calculated and recorded. Many thousands of x-rays were numerically generated and followed along their paths until they were absorbed or escaped out the bottom of the substrate material or out the top (opposite the substrate) of the converter.

The output of the simulation was a one-dimensional profile of secondary x-rays reabsorbed by the converter. The MTF due to this profile of reabsorbed x-rays, MTF$_{secondary}$, was determined by Fourier transforming this profile and was normalized to one. The degradation factor was then determined using the following formulas:

$$MTF_{system} = MTF_{nosub} * ((1-F) + F * MTF_{secondary})$$

$$\text{degradation factor} = ((1-F) + F \cdot MTF_{secondary})$$

where MTF$_{system}$ is the MTF of the converter+detection array+substrate system, MTF$_{nosub}$ is the MTF of the converter+detection array in the absence of a substrate, and F is the fractional signal, that is, the portion of the MTF$_{system}$ signal that is due to reabsorbed secondary x-rays. Values for MTF$_{nosub}$ were taken from the results of Comparative Examples 4–6. The values used in the simulation and results are given in Table 5. Fractional signal is expressed as a percentage of the contribution to the zero frequency MTF. Degradation factors determined by simulation reported in Table 5 show good agreement with measured values for the same systems reported in Table 3.

TABLE 5

Parameters for and output of Simulation
Comparative Examples 1–3 (thicknesses are in microns)

| Sim. C. Ex. | Screen Cov. (g/ft$^2$) | $t_{sub}$ | $t_{conv}$ | $L_{gen}$ | $L_{sub}$ | $L_{conv}$ | Fract. sign. (%) | Degrad. Factor |
|---|---|---|---|---|---|---|---|---|
| 22 | 31.5 | 1100 | 89 | 1268 | 1674 | 272 | 8 | 0.934 |
| 23 | 45 | 1100 | 127 | 1268 | 1674 | 272 | 9.5 | 0.923 |
| 24 | 65 | 1100 | 183 | 1268 | 1674 | 272 | 12 | 0.902 |

HYPOTHETICAL COMPARATIVE EXAMPLE 25

A detector would be prepared in the same manner as Comparative Examples 1–3 except the substrate would be twice as thick. The screen used would have a Gd$_2$O$_2$S:Tb coverage of 65 g/ft$^2$. AE(Am$^{241}$ 60 keV) would be 1.288, the fraction of signal due to the secondary x-rays would be 13.5%, and the MTF degradation at 1 cycle/mm would be 0.887.

HYPOTHETICAL EXAMPLE 26

A detector would be prepared in the same manner as in Comparative Examples 1–3 except the substrate would be one-half as thick. The screen used would have a Gd$_2$O$_2$S:Tb coverage of 65 g/ft$^2$. AE(Am$^{241}$ 60 keV) would be 0.322 and the fraction of signal due to the secondary x-rays would be 9.1% (roughly half as many secondary x-rays generated compared to Simulation Comparative Examples 1-3 for the 65 g/ft² case, but a larger fraction of those able to escape from the substrate without being reabsorbed). The MTF degradation at 1 cycle/mm would be 0.93.

HYPOTHETICAL EXAMPLE 27

A detector would be prepared in the same manner as in Comparative Examples 1-3 except the substrate would be composed of nearly 100% $SiO_2$. The screen used would have a $Gd_2O_2S$:Tb coverage of 65 g/ft². AE($Am^{241}$ 60 keV) would be 0.073, the fraction of signal due to the secondary x-rays would be negligible, and the MTF degradation at 1 cycle/mm would be near 1.0.

HYPOTHETICAL EXAMPLE 28

A detector would be prepared in the same manner as in Comparative Examples 1-3 except the substrate would be composed of pure lead. The screen used would have a $Gd_2O_2S$:Tb coverage of 65 g/ft². AE($Am^{241}$ 60 keV) would be much, much greater than 1, the fraction of signal due to the secondary x-rays would be negligible because lead is so absorbing, and the MTF degradation at 1 cycle/mm would be near 1.0.

HYPOTHETICAL EXAMPLE 29

A detector would be prepared in the same manner as in Comparative Examples 1-3 except the substrate would be composed of two layers, one layer would be 100 microns thick and be the same composition as the Corning 7059 glass of Comparative Examples 1-3, and the remaining 1000 microns would be nearly 100% $SiO_2$. The 7059 composition layer would be closer to the converter screen. The screen used would have a $Gd_2O_2S$:Tb coverage of 65 g/ft². AE($Am^{241}$ 60 keV) would be 0.125, the fraction of signal due to the secondary x-rays would be 2.7%, and the MTF degradation at 1 cycle/mm would 0.986.

HYPOTHETICAL EXAMPLE 30

A detector would be prepared in the same manner as in Comparative Examples 1-3 except the substrate would be composed of two layers, one layer would be 500 microns thick and be the same composition as the Corning 7059 glass of Comparative Examples 1-3, and the remaining 1000 microns would be nearly 100% $SiO_2$. The 7059 composition layer would be closer to the converter screen. The screen used would have a $Gd_2O_2S$:Tb coverage of 65 g/ft². AE($Am^{241}$ 60 keV) would be 0.333, the fraction of signal due to the secondary x-rays would be 8.8%, and the MTF degradation at 1 cycle/mm would 0.933.

HYPOTHETICAL COMPARATIVE EXAMPLE 31

A TFT array would be prepared in a similar manner as to that used in Comparative Examples 1-3 with the same substrate as in Comparative Examples 1-3 (Corning 7059 glass). The TFT array would be an array of collection electrodes with thin film transistors as switches at each pixel. The converter would be a layer of photoconducting selenium with a thickness of 500 micrometers with appropriate blocking layers well known to those skilled in the art of selenium layer detectors. The Se is the only absorbing material that needs to be considered as affecting the x-ray absorption of the converter. AE($Am^{241}$ 60 keV) would be 0.644 (same substrate as x-ray absorption Comparative Example 1), the fraction of signal due to the secondary x-rays would be similar to that for Simulation Comparative Examples 22-24 using the 65 g/ft² $Gd_2O_2S$ screen so use 12%. The parameter used for Se to characterize the Ba fluorescent x-ray absorption in the Se layer would be $L_{conv}$=157 microns. The MTF degradation at 1 cycle/mm would be 0.904 (similar to the degradation of the Simulation Comparative Examples 22-24 with the 65 g/ft² screen).

HYPOTHETICAL EXAMPLE 32

A detector would be prepared in the same manner as in Comparative Examples 1-3 except the substrate would be composed of less BaO such that the AE($Am^{241}$ 60 keV) of the substrate would be 0.322. The values for the x-ray absorption properties of the substrate would be two times those of Table 5. The screen used would have a $Gd_2O_2S$:Tb coverage of 65 g/ft². The fraction of signal due to the secondary x-rays would be 9.1% (fewer secondary x-rays are generated compared to Simulation Comparative Examples 22-24 for the 65 g/ft² case, but a larger fraction of those escape from the substrate without being reabsorbed). The MTF degradation at 1 cycle/mm would be 0.920.

TABLE A

| | | |
|---|---|---|
| 1 | Hydrogen | 0.3286 |
| 2 | Helium | 0.6575 |
| 3 | Lithium | 1.0015 |
| 4 | Beryllium | 1.3513 |
| 5 | Boron | 1.7136 |
| 6 | Carbon | 2.1125 |
| 7 | Nitrogen | 2.5487 |
| 8 | Oxygen | 3.0522 |
| 9 | Fluorine | 3.6542 |
| 10 | Neon | 4.3764 |
| 11 | Sodium | 5.2275 |
| 12 | Magnesium | 6.2526 |
| 13 | Aluminum | 7.5396 |
| 14 | Silicon | 9.0677 |
| 15 | Phosphorus | 10.907 |
| 16 | Sulfur | 13.116 |
| 17 | Chlorine | 15.701 |
| 18 | Argon | 18.838 |
| 19 | Potassium | 22.446 |
| 20 | Calcium | 26.527 |
| 21 | Scandium | 31.559 |
| 22 | Titanium | 37.066 |
| 23 | Vanadium | 43.387 |
| 24 | Chromium | 50.699 |
| 25 | Manganese | 59.006 |
| 26 | Iron | 68.065 |
| 27 | Cobalt | 77.970 |
| 28 | Nickel | 89.633 |
| 29 | Copper | 102.535 |
| 30 | Zinc | 116.671 |
| 31 | Gallium | 132.037 |
| 32 | Germanium | 149.234 |
| 33 | Arsenic | 168.868 |
| 34 | Selenium | 188.601 |
| 35 | Bromine | 211.327 |
| 36 | Krypton | 234.661 |
| 37 | Rubidium | 260.411 |
| 38 | Strontium | 286.876 |
| 39 | Yttrium | 315.781 |
| 40 | Zirconium | 347.023 |
| 41 | Niobium | 380.227 |
| 42 | Molybdenum | 415.772 |
| 43 | Technetium | 454.121 |
| 44 | Ruthenium | 495.089 |
| 45 | Rhodium | 538.703 |
| 46 | Palladium | 583.999 |
| 47 | Silver | 632.464 |
| 48 | Cadmium | 681.622 |
| 49 | Indium | 736.861 |
| 50 | Tin | 792.000 |
| 51 | Antimony | 847.497 |
| 52 | Tellurium | 902.718 |

TABLE A-continued

| 53 | Iodine | 976.333 |
|---|---|---|
| 54 | Xenon | 1037.67 |
| 55 | Cesium | 1169.60 |
| 56 | Barium | 1190.92 |
| 57 | Lanthanum | 1264.55 |
| 58 | Cerium | 1344.28 |
| 59 | Praseodymium | 1430.15 |
| 60 | Neodymium | 1509.86 |
| 61 | Promethium | 1601.91 |
| 62 | Samarium | 1694.53 |
| 63 | Europium | 1785.92 |
| 64 | Gadolinium | 1877.70 |
| 65 | Terbium | 1988.50 |
| 66 | Dysprosium | 2091.99 |
| 67 | Holmium | 2202.38 |
| 68 | Erbium | 2323.40 |
| 69 | Thulium | 2420.58 |
| 70 | Ytterbium | 549.232 |
| 71 | Lutetium | 582.166 |
| 72 | Hafnium | 611.698 |
| 73 | Tantalum | 650.115 |
| 74 | Tungsten | 687.342 |
| 75 | Rhenium | 723.828 |
| 76 | Osmium | 766.761 |
| 77 | Iridium | 803.994 |
| 78 | Platinum | 852.886 |
| 79 | Gold | 889.896 |
| 80 | Mercury | 944.843 |
| 81 | Thallium | 988.143 |
| 82 | Lead | 1043.06 |
| 83 | Bismuth | 1098.39 |
| 84 | Polonium | 1153.74 |
| 85 | Astatine | 1208.72 |
| 86 | Radon | 1264.02 |
| 87 | Francium | 1319.03 |
| 88 | Radium | 1380.90 |
| 89 | Actinium | 1448.03 |
| 90 | Thorium | 1533.36 |
| 91 | Protactinium | 1583.20 |
| 92 | Uranium | 1668.79 |

While specific embodiments of the invention have been shown and described herein for purposes of illustration, the protection afforded by any patent which may issue upon this application is not strictly limited to a disclosed embodiment; but rather extends to all modifications and arrangements which fall fairly within the scope of the claims which are appended hereto:

PARTS LIST 10 detector
12 converter
14 detection array
15 pixels
17 addressing structure
20 support unit
22 substrate
24 backing
30 imaging system
31 radiation source
32 modulated ionized beam
34 controller
36 memory
38 power supply
39 visualization device

We claim:

1. An ionizing radiation imaging detector, for use with an ionizing radiation beam source, said detector comprising:

a pixellated conversion-detection unit.; and a substrate supporting said conversion-detection unit, said substrate including one or more elements having atomic numbers greater than 22, said elements having a total concentration in said substrate of greater than about 1 mole percent relative to the total number of moles of elements having atomic numbers of 22 or less, said substrate having a dimensionless absorption exponent of less than 0.5 for a gamma ray emission of about 60 keV from $Am^{241}$;

wherein $$AE(Am^{241}\ 60\ keV)=t\cdot(k_1e_1+k_2e_2+k_3e_3+\ldots)$$

wherein $AE(Am^{241}\ 60\ keV)$ represents the absorption exponent of said substrate relative to the about 60 keV gamma ray emission of $Am^{241}$; t represents said thickness of said substrate in the principle direction of propagation of said ionizing radiation beam; $e_1$, $e_2$, $e_3$, ... represent the concentrations of elements in said substrate; and $k_1$, $k_2$, $k_3$, ... represent the mass attenuation coefficients of the respective elements.

2. The detector of claim 1 further comprising a backing supporting said substrate, said backing having secondary x-ray emission having an intensity of less than about 3% of the intensity of said ionizing radiation beam impinging on said substrate.

3. The detector of claim 1 wherein said conversion-detection unit further comprises a converter and a detection array, said converter providing to said detection array, an intermediate signal responsive to, and representative of, radiation absorbed by said converter.

4. The detector of claim 3 wherein said intermediate signal is modulated light.

5. The detector of claim 3 wherein said detection array collects said intermediate signal and produces a detector signal responsive to the intermediate signal, said detection array having a thickness in the principle direction of propagation of said ionizing radiation beam less than ⅕ of the thickness of said converter in the same direction.

6. The detector of claim 3 wherein said intermediate signal is a modulated electrical charge pattern.

7. The detector of claim 1 wherein said dimensionless absorption exponent is less than 0.3.

8. The detector of claim 7 having a degradation factor of at least 0.94.

9. The detector of claim 1 having a degradation factor of at least 0.9.

10. The detector of claim 1 wherein said converter has a thickness in the principle direction of propagation of said ionizing radiation beam that is from about 0.05 mm to about 1.0 mm.

11. The ionizing radiation detector of claim 1 wherein said conversion-detection unit includes a pixellated detection array having substantially the same predominant chemical constituents as said substrate.

12. The ionizing radiation detector of claim 11 wherein said detection array and said substrate are monolithic.

13. The ionizing radiation detector of claim 1 wherein said elements having an atomic number greater than 22, in said substrate, are predominantly disposed adjacent said conversion-detection unit.

14. A method of imaging by detecting an ionizing radiation beam comprising the steps of:

firstly providing a converter capable of receiving incident radiation and transmitting an intermediate signal representative of incident radiation;

secondly providing a pixellated detection unit that is capable of detecting said intermediate signal, said pixellated detection unit being operatively coupled to said converter such that said intermediate signal is provided to pixels within said pixellated detection unit; and thirdly providing a substrate supporting said converter and said detection unit, said substrate including one or more elements having atomic numbers greater than 22, said elements having a total concentration in said substrate of greater than about 1 mole percent relative to the total number of moles of elements having atomic numbers of 22 or less, said substrate having a dimensionless absorption exponent of less than 0.5 for a gamma ray emission of about 60 keV from $Am^{241}$; wherein $$AE(Am^{241}\ 60\ keV) = t \cdot (k_1 e_1 + k_2 e_2 + k_3 e_3 + \ldots)$$

wherein $AE(Am^{241}\ 60\ keV)$ represents the absorption exponent of said substrate relative to the about 60 keV gamma ray emission of $Am^{241}$; t represents said thickness of said substrate in the principle direction of propagation of said ionizing radiation beam; $e_1$, $e_2$, $e_3$, . . . represent the concentrations of elements in said substrate; and $k_1$, $k_2$, $k_3$, . . . represent the mass attenuation coefficients of the respective elements.

15. The method of claim 14 wherein said intermediate signal is modulated light.

16. The method of claim 14 wherein said detection unit has a thickness in the principle direction of propagation of said ionizing radiation beam less than 1/5 of the thickness of said converter in the same direction.

17. The method of claim 14 wherein said intermediate signal is a modulated electrical charge pattern.

18. The method of claim 14 wherein said dimensionless absorption exponent is less than 0.3.

19. The method of claim 18 having a degradation factor of at least 0.94.

20. The method of claim 14 having a degradation factor of at least 0.9.

* * * * *

UNITED STATES PATENT AND TRADEMARK OFFICE
CERTIFICATE OF CORRECTION

PATENT NO. : 5,650,626
DATED : Jul. 22, 1997
INVENTOR(S) : David P. Trauernicht, et al It is certified that error appears in the above-identified patent and that said Letters Patent is hereby corrected as shown below:

On title page, at item [73], after "Eastman Kodak Company, Rochester, N.Y." insert --Regents of the University of Michigan, Ann Arbor, MI--

Signed and Sealed this

Twenty-first Day of April, 1998

*Attest:*

BRUCE LEHMAN

*Attesting Officer*     *Commissioner of Patents and Trademarks*